(12) United States Patent
Shacham et al.

(10) Patent No.: US 9,881,680 B2
(45) Date of Patent: Jan. 30, 2018

(54) MULTI-HOST POWER CONTROLLER (MHPC) OF A FLASH-MEMORY-BASED STORAGE DEVICE

(71) Applicant: QUALCOMM Incorporated, San Diego, CA (US)

(72) Inventors: Assaf Shacham, Zichron Yaakov (IL); Lee Susman, Burgata (IL); David Teb, Haifa (IL)

(73) Assignee: QUALCOMM Incorporated, San Diego, CA (US)

(*) Notice: Subject to any disclaimer, the term of this patent is extended or adjusted under 35 U.S.C. 154(b) by 147 days.

(21) Appl. No.: 14/728,296

(22) Filed: Jun. 2, 2015

(65) Prior Publication Data
US 2015/0346795 A1 Dec. 3, 2015

Related U.S. Application Data

(60) Provisional application No. 62/007,119, filed on Jun. 3, 2014.

(51) Int. Cl.
*G06F 1/32* (2006.01)
*G11C 16/30* (2006.01)
(Continued)

(52) U.S. Cl.
CPC .............. *G11C 16/30* (2013.01); *G06F 1/266* (2013.01); *G06F 1/3203* (2013.01);
(Continued)

(58) Field of Classification Search
CPC .............................. G06F 1/3275; G06F 1/3287
See application file for complete search history.

(56) References Cited

U.S. PATENT DOCUMENTS 7,571,295 B2\* 8/2009 Sakarda .............. G06F 12/0891
711/154
7,802,060 B2\* 9/2010 Hildebrand .............. G11C 5/14
710/36
(Continued)

FOREIGN PATENT DOCUMENTS

EP 2492916 A1 8/2012
JP H01145717 A 6/1989
(Continued)

OTHER PUBLICATIONS

International Preliminary Report on Patentability for PCT/US2015/033948, dated May 13, 2016, 23 pages.
(Continued)

*Primary Examiner* — Thomas Lee
*Assistant Examiner* — Mohammad A Rahman
(74) *Attorney, Agent, or Firm* — Withrow & Terranova, PLLC

(57) ABSTRACT

A multi-host power controller (MHPC) of a flash-memory-based storage device is disclosed. In one aspect, the MHPC receives power mode change requests from each of multiple input/output (I/O) clients. The MHPC extracts and stores a "vote," or a requested power mode, from the power mode change requests, and then applies a voting logic to the stored votes to determine whether to transition the flash-memory-based storage device between power modes. If the flash-memory-based storage device is not currently operating in the power mode determined by the MHPC, the MHPC is configured to issue a power mode change command to the flash-memory-based storage device to transition to the determined power mode. In this manner, the MHPC is able to control the power mode of the flash-memory-based storage device while receiving direct power mode change requests from multiple I/O clients.

27 Claims, 11 Drawing Sheets

(51) Int. Cl.
*G06F 1/26* (2006.01)
*G06F 13/16* (2006.01)

(52) U.S. Cl.
CPC .......... *G06F 1/3275* (2013.01); *G06F 1/3287* (2013.01); *G06F 13/1663* (2013.01)

(56) References Cited

U.S. PATENT DOCUMENTS

| | | | |
|---|---|---|---|
| 8,793,364 B1* | 7/2014 | Barkelew | G06F 1/24 709/224 |
| 9,231,976 B2* | 1/2016 | Buruganahalli | |
| 9,690,720 B2* | 6/2017 | Shacham | G06F 13/1642 |
| 2004/0003300 A1* | 1/2004 | Malueg | G06F 1/3203 713/300 |
| 2008/0162770 A1* | 7/2008 | Titiano | G06F 1/3203 710/309 |
| 2010/0058087 A1* | 3/2010 | Borras | G06F 1/3203 713/322 |
| 2010/0161936 A1 | 6/2010 | Royer et al. | |
| 2011/0221271 A1* | 9/2011 | Bodnar | G06F 1/3209 307/31 |
| 2011/0246803 A1* | 10/2011 | Myrah | G06F 1/206 713/324 |
| 2011/0276817 A1* | 11/2011 | Fullerton | G06F 1/3203 713/324 |
| 2011/0283046 A1 | 11/2011 | Koseki | |
| 2012/0030408 A1 | 2/2012 | Flynn et al. | |
| 2013/0060981 A1 | 3/2013 | Horn et al. | |
| 2013/0275656 A1 | 10/2013 | Talagala et al. | |
| 2013/0290606 A1 | 10/2013 | Alessi et al. | |
| 2014/0040382 A1* | 2/2014 | Kanigicherla | H04L 67/10 709/205 |
| 2014/0168682 A1* | 6/2014 | Muto | H04N 1/00493 358/1.13 |
| 2014/0245034 A1* | 8/2014 | Rotem | G06F 1/26 713/300 |
| 2014/0298056 A1* | 10/2014 | Seki | G06F 1/3225 713/320 |
| 2014/0325013 A1 | 10/2014 | Tamir et al. | |
| 2015/0074338 A1 | 3/2015 | Raviv et al. | |
| 2015/0242268 A1 | 8/2015 | Wu et al. | |
| 2015/0347016 A1 | 12/2015 | Shacham et al. | |
| 2015/0347017 A1 | 12/2015 | Shacham et al. | |

FOREIGN PATENT DOCUMENTS

| | | |
|---|---|---|
| JP | 2015519619 A | 7/2015 |
| WO | 2012143945 A2 | 10/2012 |
| WO | 2013109640 A1 | 7/2013 |
| WO | 2013171789 A1 | 11/2013 |

OTHER PUBLICATIONS

Author Unknown, "Embedded MultiMediaCard (e-MMC) e-MMC/Card Product Standard, High Capacity, including Reliable Write, Boot, Sleep Modes, Dual Data Rate, Multiple Partitions Supports and Security Enhancement," JEDEC Solid State JESD84-A44, Mar. 2009, JEDEC Solid State Technology Association, 234 pages.

Author Unknown, "Universal Flash Storage (UFS 1.1)," JEDEC Standard JESD220A, Jun. 2012, JEDEC Solid State Technology Association, 408 pages.

International Search Report and Written Opinion for PCT/US2015/033948, dated Sep. 30, 2015, 15 pages.

\* cited by examiner

US 9,881,680 B2

MULTI-HOST POWER CONTROLLER (MHPC) OF A FLASH-MEMORY-BASED STORAGE DEVICE

PRIORITY CLAIM

The present application claims priority to U.S. Provisional Patent Application Ser. No. 62/007,119 filed on Jun. 3, 2014 and entitled "MULTI-HOST POWER CONTROLLER OF A UNIVERSAL FLASH STORAGE (UFS) MEMORY DEVICE," the contents of which is incorporated herein by reference in its entirety.

BACKGROUND

I. Field of the Disclosure

The technology of the disclosure relates generally to flash-memory-based storage in mobile computing devices.

II. Background

Flash memory is a non-volatile data storage medium to which data may be electronically written and erased. Flash memory is presently used in a variety of flash-memory-based storage devices, including memory cards, solid-state drives, and Universal Serial Bus (USB) flash drives. Flash-memory-based storage devices may offer fast read and write times comparable to dynamic Random Access Memory (RAM) while providing higher durability and shock resistance than conventional hard disks.

To facilitate the widespread use of flash-memory-based storage devices, a number of standards have been developed or are currently under development. One such standard is Universal Flash Storage (UFS), developed by the Joint Electron Device Engineering Council (JEDEC) for flash-memory-based storage in mobile computing devices, such as smart phones and tablet computers. UFS adopts the Small Computer System Interface (SCSI) Architecture Model and command protocols supporting multiple commands with command queuing features, thus enabling a multi-thread programming paradigm. Another standard developed by JEDEC is the Embedded MultiMediaCard (eMMC) standard, which offers a simplified application interface design, small package sizes, and low power consumption. eMMC flash-memory-based storage devices are presently one of the primary forms of storage in mobile devices.

Conventional flash-memory-based storage device standards such as UFS and eMMC are currently designed for management and usage by a single input/output (I/O) client. However, many modern computing devices are capable of supporting multiple I/O clients (e.g., hosts or other processor subsystems) simultaneously using virtualization environments. In such virtualization environments, multiple I/O clients may each need to interact with a single flash-memory-based storage device as if it were the only host of the flash-memory-based storage device. Similarly, the flash-memory-based storage device may need to operate as if it is communicating with only a single I/O client, when, in fact, it is communicating with multiple I/O clients.

In particular, when flash-memory-based storage standards are extended to a multi-host environment, the flash-memory-based storage device must be able to maintain effective power control while supporting multiple I/O clients. In conventional flash-memory-based storage devices interacting with a single host, power control is relatively simple, in that the single host alone controls a power state of the flash-memory-based storage device. However, to achieve effective power control in a multi-host environment, a flash-memory-based storage device may need to transition between power modes in response to receiving requests from multiple hosts, as opposed to a single host.

SUMMARY OF THE DISCLOSURE

Aspects disclosed in the detailed description include a multi-host power controller (MHPC) of a flash-memory-based storage device. Related methods and systems are also disclosed. In one aspect, a multi-host power controller (MHPC) is provided for controlling a power mode of a flash-memory-based storage device, such as a Universal Flash Storage (UFS) device or an Embedded MultiMediaCard (eMMC) device, as non-limiting examples. The MHPC receives power mode change requests, such as Small Computer System Interface (SCSI) START STOP UNIT (SSU) commands or eMMC Sleep (CMD5) commands, as non-limiting examples, from each of multiple input/output (I/O) clients. The MHPC extracts and stores a "vote," or a requested power mode, from the power mode change requests, and then applies a voting logic to the stored votes to determine whether to transition the flash-memory-based storage device between power modes. If the flash-memory-based storage device is not currently operating in the power mode determined by the MHPC, the MHPC is configured to issue a power mode change command to the flash-memory-based storage device to transition to the determined power mode. In some aspects, the multi-host controller is configured to track responses from the flash-memory-based storage device caused by such power mode, and send a response to the corresponding I/O client. Further, some aspects may provide that the multi-host controller is configured to generate and send a response to each I/O client whose power mode change request does not result in a power mode transition of the flash-memory-based storage device. In this manner, the multi-host controller is able to control the power of the flash-memory-based storage device while receiving direct power mode change requests from multiple I/O clients.

In another aspect, an MHPC of a multi-host controller is provided. The MHPC is communicatively coupled to a plurality of I/O clients and to a flash-memory-based storage device. The MHPC comprises an MHPC request status register that is configured to indicate a last requested power mode for each I/O client of the plurality of I/O clients. The MHPC is configured to receive, via a transfer request (TR) filter circuit of the multi-host controller, a power mode change request from an I/O client of the plurality of I/O clients. The MHPC is further configured to extract a power mode vote from the power mode change request, the power mode vote indicative of a power mode requested by the I/O client. The MHPC is also configured to store the power mode vote in the MHPC request status register of the MHPC. The MHPC is additionally configured to apply a voting logic to the MHPC request status register to determine whether a power mode of the flash-memory-based storage device should be changed. The MHPC is further configured to, responsive to determining that the power mode should be changed, issue a power mode change command from the MHPC to the flash-memory-based storage device to change the power mode.

In another aspect, a method for controlling power modes of a flash-memory-based storage device for multiple hosts is provided. The method comprises receiving, by an MHPC via a TR filter circuit of a multi-host controller, a power mode change request from an I/O client of a plurality of I/O clients. The method further comprises extracting, by the MHPC, a power mode vote from the power mode change request, the power mode vote indicative of a power mode requested by the I/O client. The method also comprises storing, by the MHPC, the power mode vote in an MHPC request status register of the MHPC, the MHPC request status register indicating a last requested power mode for each I/O client of the plurality of I/O clients. The method additionally comprises applying, by the MHPC, a voting logic to the MHPC request status register to determine whether a power mode of the flash-memory-based storage device should be changed. The method further comprises, responsive to determining that the power mode should be changed, issuing a power mode change command from the MHPC to the flash-memory-based storage device to change the power mode.

In another aspect, an MHPC of a multi-host controller is provided. The MHPC comprises a means for receiving a power mode change request from an I/O client of a plurality of I/O clients. The MHPC further comprises a means for extracting a power mode vote from the power mode change request, the power mode vote indicative of a power mode requested by the I/O client. The MHPC also comprises a means for storing the power mode vote in an MHPC request status register of the MHPC, the MHPC request status register indicating a last requested power mode for each I/O client of the plurality of I/O clients. The MHPC additionally comprises a means for applying a voting logic to the MHPC request status register to determine whether a power mode of a flash-memory-based storage device should be changed. The MHPC further comprises a means for issuing a power mode change command from the MHPC to the flash-memory-based storage device to change the power mode, responsive to determining that the power mode should be changed.

DETAILED DESCRIPTION

Figure 1:
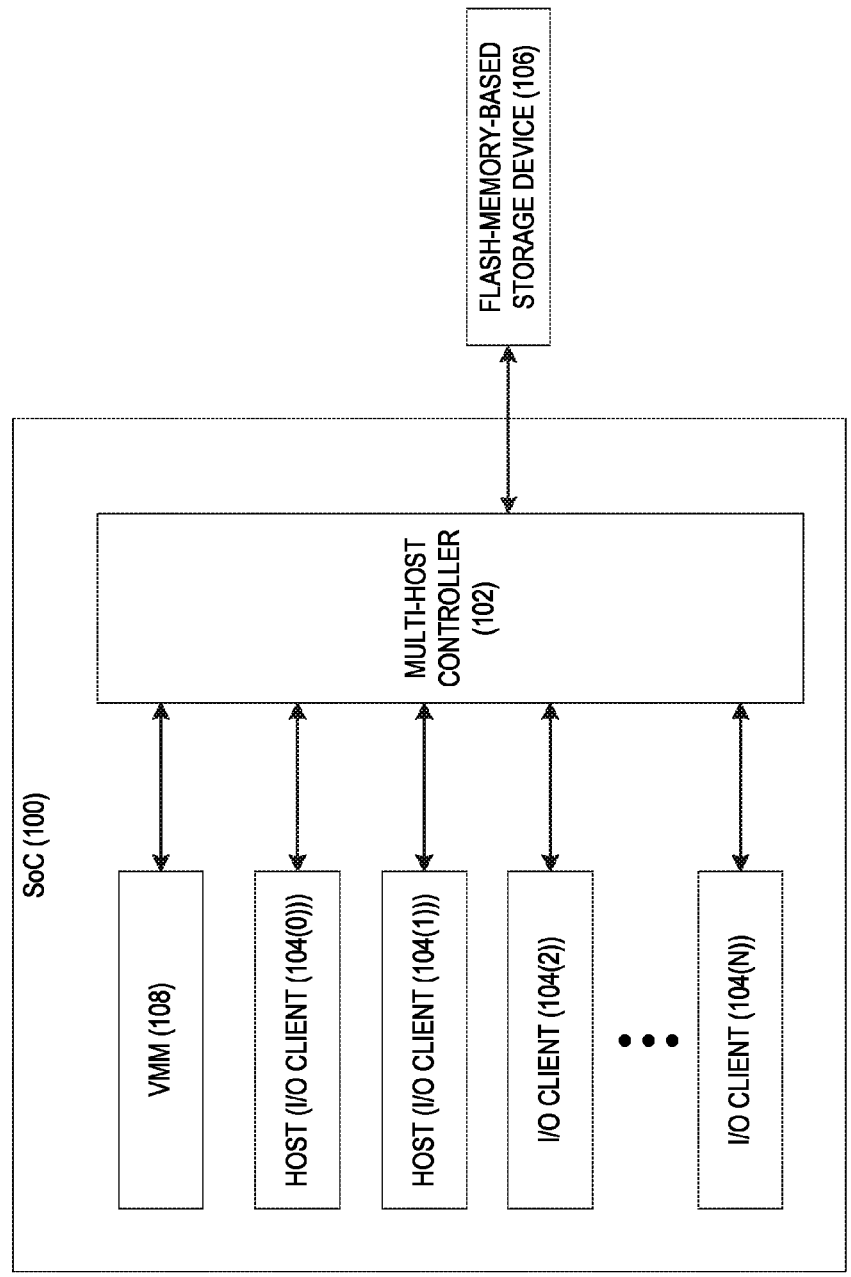
FIG. 1 is a block diagram of an exemplary flash-memory-based storage device and an exemplary system-on-a-chip (SoC) employing a plurality of hosts and a multi-host controller.

With reference now to the drawing figures, several exemplary aspects of the present disclosure are described. The word "exemplary" is used herein to mean "serving as an example, instance, or illustration." Any embodiment described herein as "exemplary" is not necessarily to be construed as preferred or advantageous over other aspects.

Aspects disclosed in the detailed description include a multi-host power controller (MHPC) of a flash-memory-based storage device. Related methods and systems are also disclosed. In one aspect, a multi-host power controller (MHPC) is provided for controlling a power mode of a flash-memory-based storage device, such as a Universal Flash Storage (UFS) device or an Embedded MultiMediaCard (eMMC) device, as non-limiting examples. The MHPC receives power mode change requests, such as Small Computer System Interface (SCSI) START STOP UNIT (SSU) commands or eMMC Sleep (CMD5) commands, as non-limiting examples, from each of multiple input/output (I/O) clients. The MHPC extracts and stores a "vote," or a requested power mode, from the power mode change requests, and then applies a voting logic to the stored votes to determine whether to transition the flash-memory-based storage device between power modes. If the flash-memory-based storage device is not currently operating in the power mode determined by the MHPC, the MHPC is configured to issue a power mode change command to the flash-memory-based storage device to transition to the determined power mode. In some aspects, the multi-host controller is configured to track responses from the flash-memory-based storage device caused by such power mode, and send a response to the corresponding I/O client. Further, some aspects may provide that the multi-host controller is configured to generate and send a response to each I/O client whose power mode change request does not result in a power mode transition of the flash-memory-based storage device. In this manner, the multi-host controller is able to control the power of the flash-memory-based storage device while receiving direct power mode change requests from multiple I/O clients.

In this regard, FIG. 1 is a block diagram of an exemplary system-on-a-chip (SoC) 100 including a multi-host controller 102. In the example of FIG. 1, the multi-host controller 102 is provided to enable a plurality of I/O clients 104(0)-104(N) to access a single flash-memory-based storage device 106. In some aspects, the flash-memory-based storage device 106 may comprise a Universal Flash Storage (UFS) device or an Embedded MultiMediaCard (eMMC) device, as non-limiting examples. Notably, while the flash-memory-based storage device 106 is embedded adjacent to the SoC 100 within a mobile device in this aspect, other aspects may achieve similar functionality when employing the flash-memory-based storage device 106 as a removable memory device.

The SoC 100 also includes a virtual machine manager (VMM) 108, which provides virtualization functionality and management for the I/O clients 104(0)-104(N). The VMM 108 may be a software module that is executed by a processor (not shown) of the SoC 100, and that is resident in the system memory of the SoC 100 or other memory location as needed or desired. Each of the I/O clients 104(0)-104(N) may comprise a host software entity (such as the I/O client 104(0) and the I/O client 104(1) of FIG. 1), which is executed on the processor of the SoC 100 and/or on a processor subsystem (not shown) of the SoC 100. The multi-host controller 102 may act as an intermediary between the I/O clients 104(0)-104(N) and the flash-memory-based storage device 106. In this manner, the multi-host controller 102 may control interactions between the I/O clients 104(0)-104(N) and the flash-memory-based storage device 106 such that the I/O clients 104(0)-104(N) each interact with the flash-memory-based storage device 106 as if it were the only I/O client 104(0)-104(N) communicating with the flash-memory-based storage device 106. Similarly, the multi-host controller 102 may be configured to enable the flash-memory-based storage device 106 to operate as if it is communicating with only a single I/O client 104(0)-104(N), when, in fact, it is communicating with multiple I/O clients 104(0)-104(N).

Figure 2:
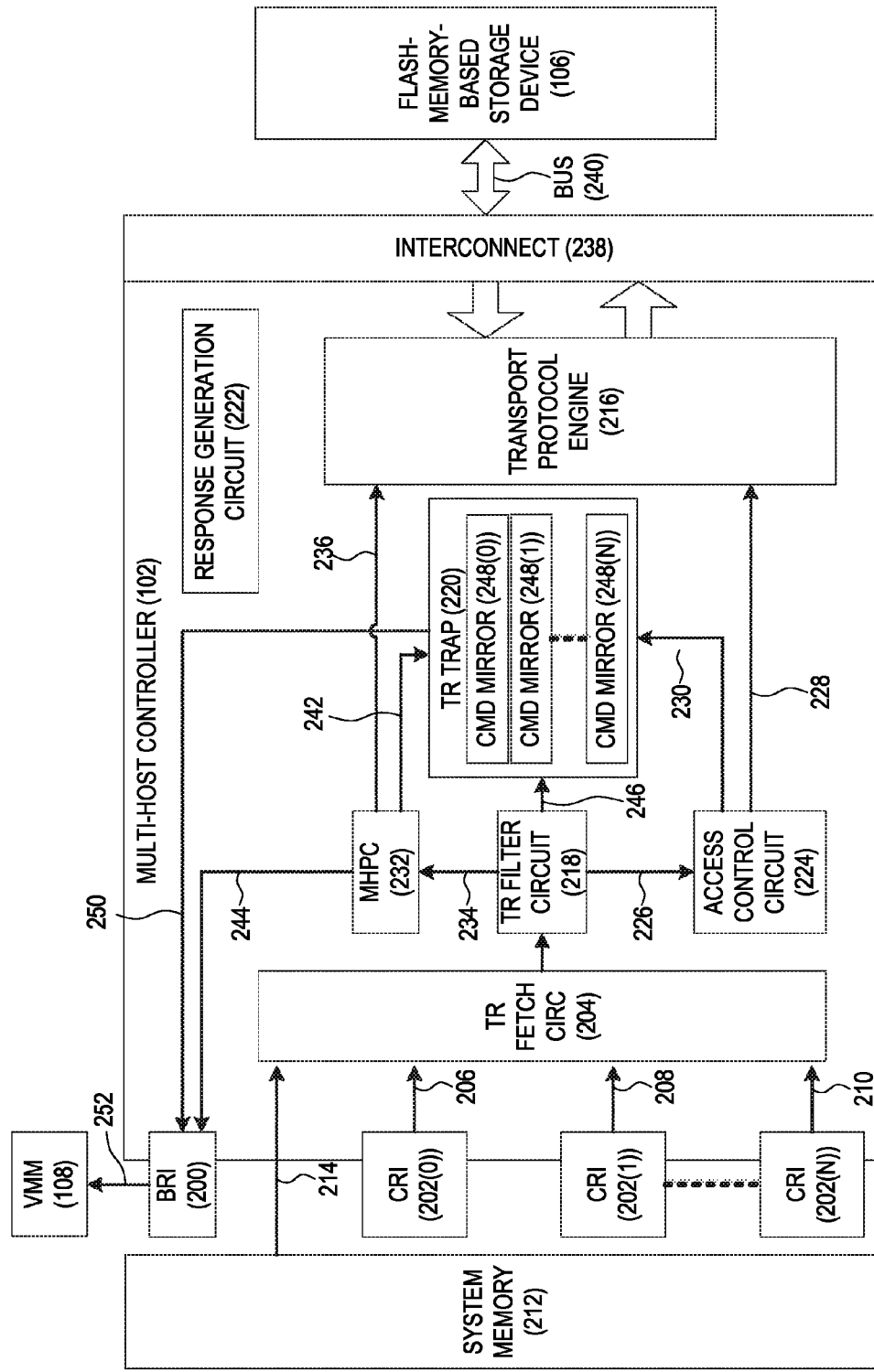
FIG. 2 is a block diagram of an exemplary multi-host controller employing a multi-host power controller (MHPC)

To better illustrate exemplary constituent elements of the multi-host controller 102 of FIG. 1 according to some aspects, FIG. 2 is provided. It is to be understood that the multi-host controller 102 may include more or fewer elements than illustrated in FIG. 2, according to the needs of the flash-memory-based storage device standard (e.g., UFS or eMMC, as non-limiting examples) in use. As seen in FIG. 2, the multi-host controller 102 includes a base register interface (BRI) 200 through which the VMM 108 of FIG. 1 may communicate with the multi-host controller 102. The multi-host controller 102 also includes client register interfaces (CRIs) 202(0)-202(N). Each of the CRIs 202(0)-202(N) represents an interface for corresponding ones of the I/O clients 104(0)-104(N) of FIG. 1 to transmit a transfer request (TR) (not shown) to the multi-host controller 102. According to some aspects disclosed herein, the TR may comprise a power mode change request, such as a SCSI SSU command or an eMMC Sleep (CMD5) command, and/or other requests. The CRIs 202(0)-202(N) may also be used to transmit other, non-TR requests, such as queries or no-operation (NOP) instructions.

As seen in FIG. 2, the CRIs 202(0)-202(N) are communicatively coupled to TR fetch circuit (TR FETCH CIRC) 204 of the multi-host controller 102, as indicated by arrows 206, 208, and 210, respectively. In some aspects, the TR fetch circuit 204 may be responsible for fetching a transport protocol descriptor, such as a UFS Transport Protocol (UTP) Transfer Request Descriptor (UTRD) (not shown) or an eMMC Task Descriptor (TD), from system memory, and decoding the transport protocol descriptor to determine a location of a command descriptor, such as a UTP command descriptor (UCD) (not shown). The TR fetch circuit 204 may then fetch a TR section (not shown) of the command descriptor from a system memory 212, as indicated by arrow 214.

In a conventional host controller, the TR fetch circuit 204 would then extract parameters from the TR (e.g., a transaction code (TC) and a SCSI op-code (OPC) in aspects based on the UFS standard, or a Command Index and a Command Argument in aspects based on the eMMC standard). The TR fetch circuit 204 then forwards the entire TR to a transport protocol engine 216 (e.g., a UTP engine or an eMMC transport protocol engine) for processing. However, in a multi-client environment, additional inspection and processing of the TR may be required. For instance, it may be desirable to provide custom handling for TRs of different types, or to trap or terminate a TR. Accordingly, the multi-host controller 102 is configured to provide command trapping functionality. The multi-host controller 102 thus includes a TR filter circuit 218 for TR inspection and processing, a TR trap 220 for command trapping, and response generation circuit 222 for facilitating the transmission of responses to the I/O clients 104(0)-104(N). Operations of the TR filter circuit 218, the TR trap 220, and the response generation circuit 222 are discussed in greater detail below.

With continuing reference to FIG. 2, inspection and processing of every TR fetched by the TR fetch circuit 204 is carried out by the TR filter circuit 218 of the multi-host controller 102. The TR filter circuit 218 determines how a TR is to be processed based on its contents.

If the contents of the TR indicate that the TR corresponds to a read or write command, the TR may be forwarded to an access control circuit 224 by the TR filter circuit 218, as indicated by arrow 226. The access control circuit 224 provides hardware enforcement of read/write access rules to logical units (not shown). If the TR is validated by the access control circuit 224, the TR is passed on to the transport protocol engine 216 as indicated by arrow 228. TRs that are denied by the access control circuit 224 are trapped for software processing, as indicated by arrow 230.

If the contents of the TR indicate that the TR corresponds to a power mode change request, the TR is sent to an MHPC 232 by the TR filter circuit 218, as indicated by arrow 234. As noted above, the power mode change request in some aspects may comprise a SCSI SSU command or an eMMC Sleep (CMD5) command, as non-limiting examples. In some aspects in which the flash-memory-based storage device 106 is a UFS storage device, the power mode change request may include a Power Condition (PC) field having a value of one (1) representing an active power mode, a value of two (2) representing a sleep power mode, and a value of three (3) representing a power down power mode. According to some aspects in which the flash-memory-based storage device 106 is an eMMC storage device, the power mode change request may include a one-bit indication of one of SLEEP and ACTIVE power modes.

The MHPC 232 of FIG. 2 is a hardware state machine that implements a voting mechanism between the I/O clients 104(0)-104(N) to control the power modes of the flash-memory-based storage device 106, and is explained in greater detail below. If the TR is successfully processed by the MHPC 232, the TR may be passed to the transport protocol engine 216, as indicated by arrow 236. The transport protocol engine 216 then communicates power mode change commands and responses with the flash-memory-based storage device 106 via an interconnect 238 and a bus 240. Otherwise, the MHPC 232 may silently discard the TR, or may trap the TR for software processing, as indicated by arrow 242. The MHPC 232 may also generate an error interrupt 244 upon notification by the flash-memory-based storage device 106 that a requested power mode change was unsuccessful. If the TR includes other commands, the TR may be intercepted and trapped by the TR filter circuit 218, as indicated by arrow 246.

As seen in FIG. 2, the TR trap 220 is provided by the multi-host controller 102 to store trapped TRs. Within the TR trap 220 are command (CMD) mirrors 248(0)-248(N), each associated with one of the CRIs 202(0)-202(N). A trapped TR is stored in the CMD mirror 248(0)-248(N) of the CRI 202(0)-202(N) from which the TR was received. An interrupt (represented by arrows 250 and 252) is generated to the VMM 108 via the BRI 200 to indicate that the TR is trapped. The VMM 108 may then further process the TR by reading the contents of the appropriate CMD mirror 248(0)-248(N) to extract information, and generating a response to the originating CRI 202(0)-202(N).

Once a TR is trapped, the TR fetch circuit 204 has completed its processing, and may proceed with fetching the next TR for another CRI 202(0)-202(N). Until the trapped TR is processed by the VMM 108, the CRI 202(0)-202(N) associated with the trapped TR is removed from TR fetch arbitration. Only when the VMM 108 processes the TR by ordering the multi-host controller 102 to forward or discard the TR may subsequent TRs from the same CRI 202(0)-202(N) be fetched by the TR fetch circuit 204.

Figure 3:
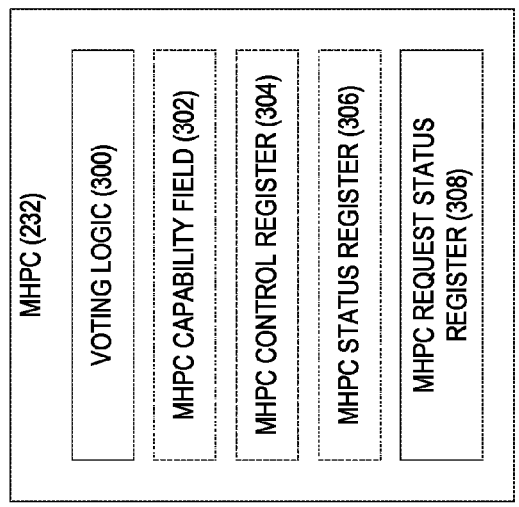
FIG. 3 is a block diagram illustrating exemplary constituent elements of the MHPC of FIG. 2.

FIG. 3 illustrates exemplary constituent elements of the MHPC 232 of FIG. 2 for controlling power mode changes of the flash-memory-based storage device 106 of FIGS. 1 and 2 for multiple I/O clients 104(0)-104(N). Notably, in an exemplary aspect disclosed herein, the MHPC 232 includes a voting logic 300 for applying voting rules to requested power mode changes, which is discussed in greater detail below with respect to FIGS. 4A-4E.

In particular, some aspects of the MHPC 232 may include an MHPC capability field 302 that indicates whether the MHPC 232 is supported in the multi-host controller 102. Upon initialization of the multi-host controller 102, virtualization management software (such as, for example, the VMM 108) may read the MHPC capability field 302. If the MHPC capability field 302 stores a logical "0" value, the MHPC 232 is not supported, leaving the virtualization management software with two options. First, the virtualization management software may configure the TR filter circuit 218 to pass all power mode change requests from each of the I/O clients 104(0)-104(N) to the flash-memory-based storage device 106, and execute software designed such that only one I/O client 104(0)-104(N) may transmit such power mode change requests. Alternatively, the virtualization management software may configure the TR filter circuit 218 to trap all power mode change requests, and implement a software voting algorithm in the virtualization management software. However, if the MHPC capability field 302 stores a logical "1" value, the virtualization management software may enable the MHPC 232 for each of the I/O clients 104(0)-104(N) during its bootup process or during virtual machine creation. In particular, when a virtual machine is created or a client subsystem boots up, the virtual machine or subsystem is assigned a client identifier (ID) and allocated a CRI, such as one of the CRIs 202(0)-202(N) of the multi-host controller 102 of FIG. 2.

The MHPC 232 in some aspects may also include an MHPC control register 304 that is used by virtualization management software (such as the VMM 108, as a non-limiting example) to indicate which of the I/O clients 104(0)-104(N) are permitted to vote for power mode control of the flash-memory-based storage device 106, as described below. For example, power mode change requests (not shown) for one of the I/O clients 104(0)-104(N) that is permitted to vote for power control are decoded and processed by the MHPC 232 hardware. However, power mode change requests for one of the I/O clients 104(0)-104(N) that is not permitted to vote for power control are "trapped," as described above with respect to FIG. 2. Further, according to some aspects, the MHPC 232 may include an MHPC status register 306 that informs the virtualization management software of various status metrics of the MHPC 232 hardware (e.g., current power condition and/or last request received, as non-limiting examples). The MHPC 232 also includes an MHPC request status register 308 that informs the virtualization management software of the power conditions/modes requested by each of the I/O clients 104(0)-104(N).

As described above, the MHPC 232 applies rules embodied by the voting logic 300 when processing power mode change requests issued by the I/O clients 104(0)-104(N). The voting logic 300 is now described in greater detail. In particular, the voting logic 300 implements a policy in which the flash-memory-based storage device 106 operates in the lowest power mode permitted by all participating I/O clients 104(0)-104(N), or, alternatively, the highest power mode required by any of the participating I/O clients 104(0)-104(N). As used herein, "participating" I/O clients 104(0)-104(N) are defined as I/O clients 104(0)-104(N) who are permitted to vote and whose power mode votes, respectively, are stored in the MHPC request status register 308. As indicated above, power mode change requests that are issued by I/O clients 104(0)-104(N) that are not permitted to participate in voting are ignored during the voting process (e.g., by trapping the commands, in some aspects). In this manner, if there is at least one participating I/O client 104(0)-104(N) whose requested power mode is active, the flash-memory-based storage device 106 operates in the active power mode. Otherwise, if there is at least one participating I/O client 104(0)-104(N) whose requested power mode is sleep, the flash-memory-based storage device 106 operates in the sleep power mode. According to aspects based on standards such as UFS, in which power modes other than the active power mode and the sleep power mode may be available, the flash-memory-based storage device 106 may operate in a power down power mode if there are no participating I/O clients 104(0)-104(N) requesting the active or sleep power modes, or if there are no participating I/O clients 104(0)-104(N). In aspects based on standards such as eMMC in which only the active power mode and the sleep power mode are available, the flash-memory-based storage device 106 may operate in the active power mode if requested by at least one participating I/O client 104(0)-104(N), and may remain in the sleep power mode otherwise.

In this regard, an example of the MHPC 232 employing the power mode control process described above is provided in FIGS. 4A-4E. For the sake of clarity, elements of FIGS. 1-3 are referenced in describing FIGS. 4A-4E. In the initial state illustrated in FIG. 4A, I/O clients 104(0)-104(2) are currently participating I/O clients 104(0)-104(2), as indicated by bit values 406, 408, and 410, respectively, stored in the MHPC control register 304 of the MHPC 232. The MHPC request status register 308 of the MHPC 232 stores power mode votes 400, 402, and 404 most recently extracted from power mode change requests (not shown) of respective I/O clients 104(0)-104(2). In the examples of FIGS. 4A-4E, the flash-memory-based storage device 106 is a UFS storage device for which a power mode vote 400, 402, 404 value of one (1) represents an active power mode, a value of two (2) represents a sleep power mode, and a value of three (3) represents a power down power mode. Accordingly, the power mode votes 400, 402, and 404 indicate that the I/O client 104(0) is active, the I/O client 104(1) has requested a power down power mode, and the I/O client 104(2) is active.

Figure 4A:
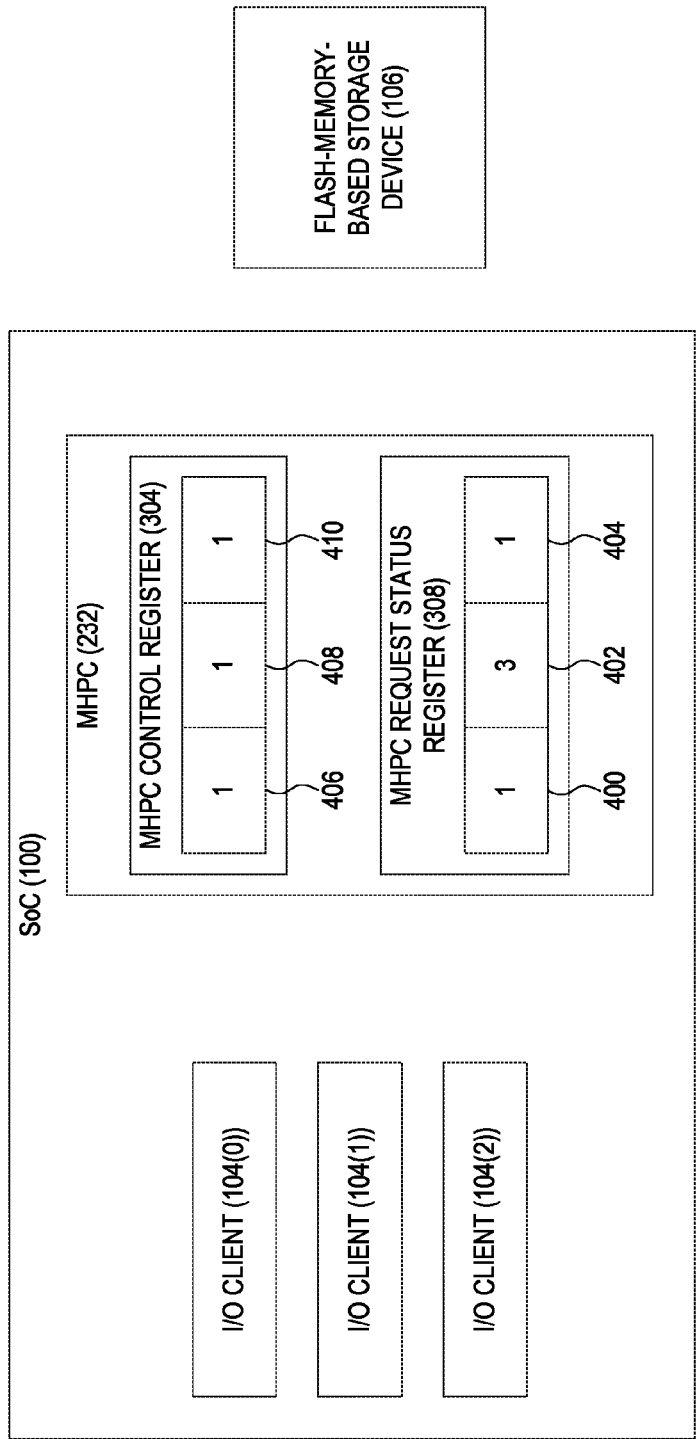
FIGS. 4A-4E are block diagrams illustrating operations of the MHPC of FIGS. 2 and 3 for receiving power mode change requests, applying a voting logic to control power modes of a flash-memory-based storage device, and generating responses to requesting input/output (I/O) clients.
Figure 4B:
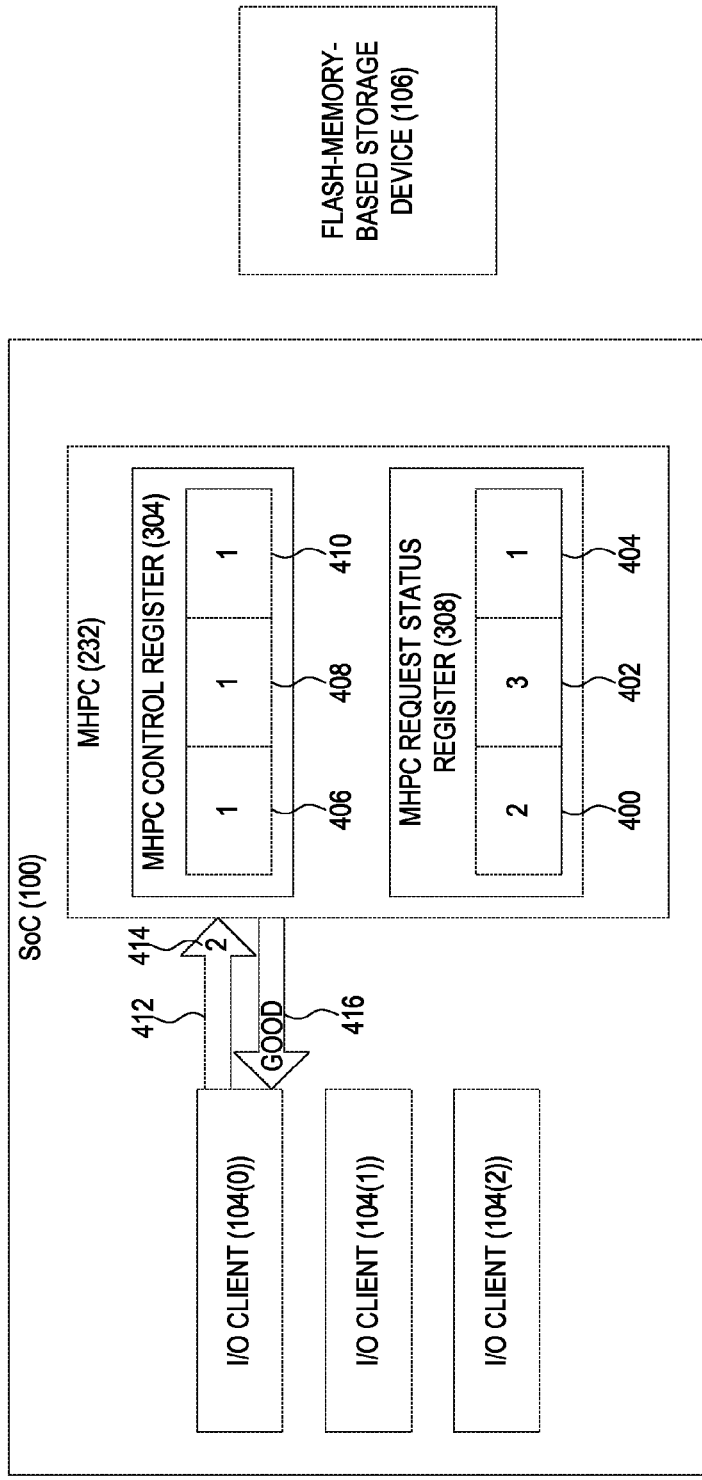

In FIG. 4B, the I/O client 104(0) issues a power mode change command 412 requesting that the flash-memory-based storage device 106 transition to the sleep mode. After confirming that the I/O client 104(0) is still a participating I/O client 104(0), the MHPC 232 extracts a power mode vote 414 having a value of two (2), corresponding to the sleep mode. The power mode vote 414 is stored as the power mode vote 400 in the MHPC request status register 308. The MHPC 232 then applies the voting logic 300 as described above to the MHPC request status register 308 to determine whether a power mode of the flash-memory-based storage device 106 should be changed. In the example of FIG. 4B, no power mode transition is initiated, because the I/O client 104(2) is still active. Thus, a response message 416 with a "GOOD" status indicating a successful power mode change is transmitted to the I/O client 104(0).

Figure 4C:
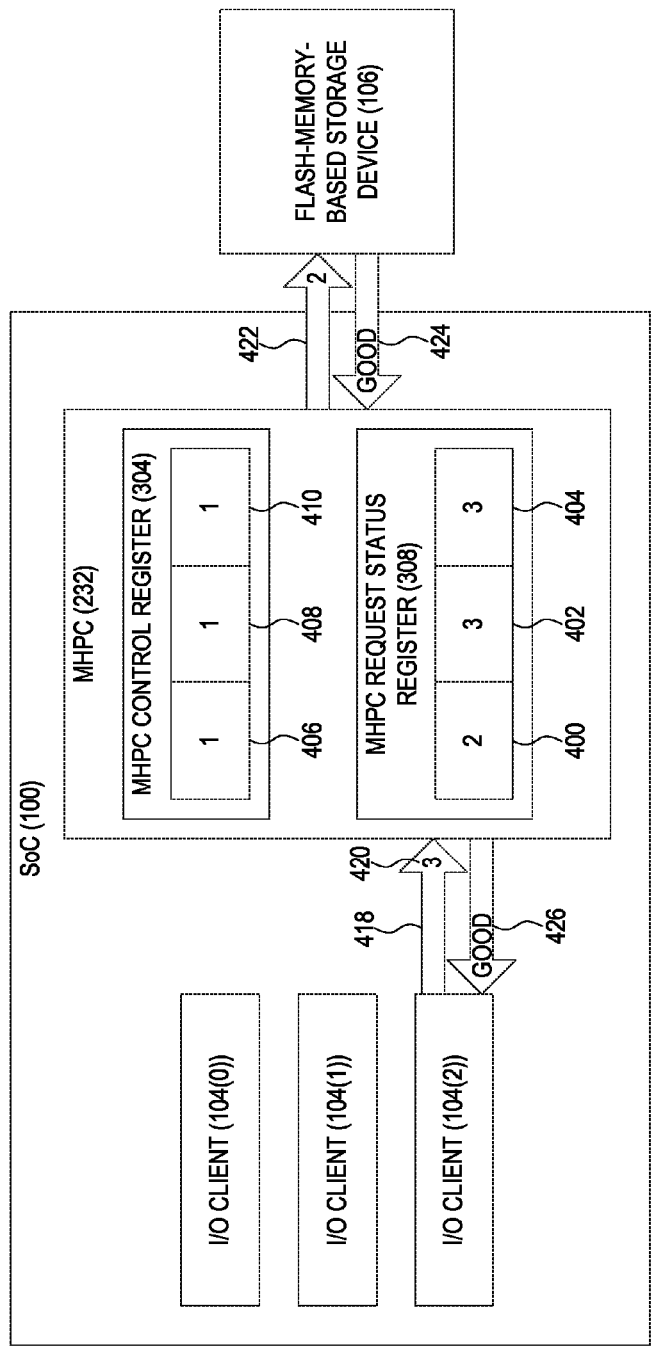

Turning now to FIG. 4C, the I/O client 104(2) next issues a power mode change request 418 requesting that the flash-memory-based storage device 106 transition to a power down power mode. The MHPC 232 determines, based on the bit value 410, that the I/O client 104(2) is a participating I/O client 104(2), and then extracts a power mode vote 420 having a value of three (3), corresponding to the power down power mode. The MHPC 232 stores the power mode vote 420 as the power mode vote 404 in the MHPC request status register 308, and applies the voting logic 300 to the MHPC request status register 308 to determine whether a power mode of the flash-memory-based storage device 106 should be changed. As seen in FIG. 4C, because the I/O client 104(0) previously requested the sleep power mode (e.g., a higher power mode than the power down power mode requested by the I/O client 104(2)) as indicated by the power mode vote 400, the MHPC 232 determines that the power mode of the flash-memory-based storage device 106 should be changed. Accordingly, a power mode change command 422 is sent to the flash-memory-based storage device 106 to request that the power mode transition to the sleep power mode. A response message 424 with a "GOOD" status indicating a successful power mode change is received from the flash-memory-based storage device 106, and is transmitted to the I/O client 104(2) as a response message 426 indicating a successful power mode change.

Figure 4D:
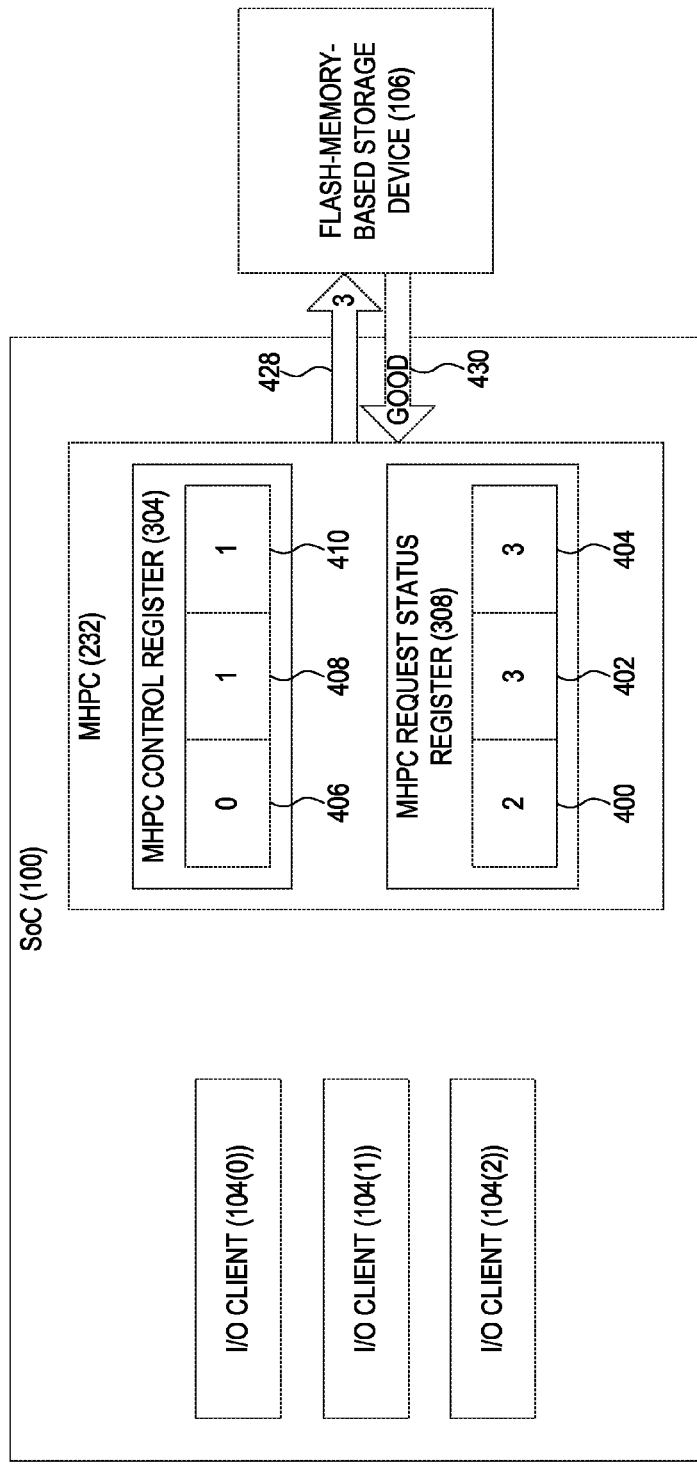

In FIG. 4D, the bit value 406 corresponding to the I/O client 104(0) has been turned off, thus making the I/O client 104(0) a non-participating I/O client 104(0). The MHPC 232 thus applies the voting logic 300 based on the power mode votes 402, 404 in the MHPC request status register 308 corresponding to participating I/O clients 104(1), 104(2). Because the participating I/O clients 104(1), 104(2) both requested the power down power mode, the MHPC 232 determines that the flash-memory-based storage device 106 should transition to the power down power mode. Thus, the MHPC 232 sends a power mode change command 428 to the flash-memory-based storage device 106 to request a transition to the power down power mode, and receives a response message 430 having a "GOOD" status indicating a successful power mode change in response.

Figure 4E:
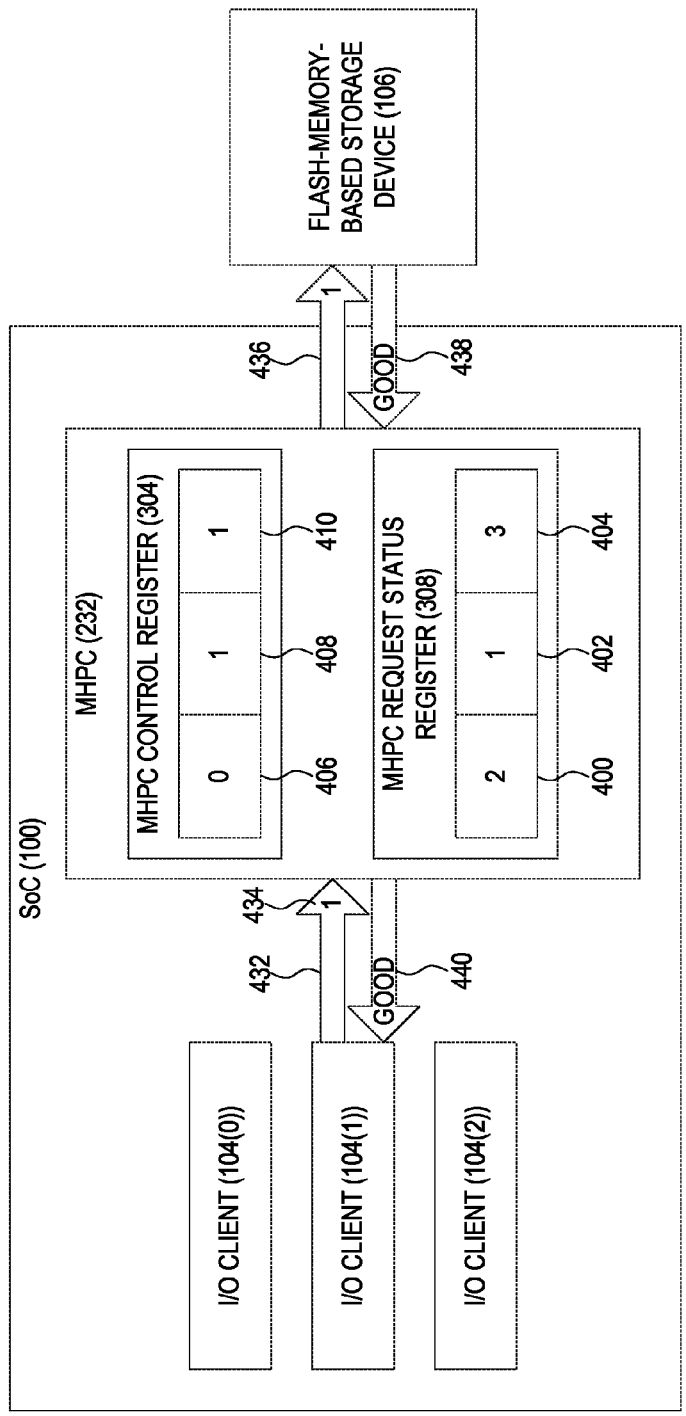

Referring now to FIG. 4E, the I/O client 104(1) sends a power mode change request 432 requesting that the flash-memory-based storage device 106 transition to the active power mode. After confirming that the I/O client 104(1) is still a participating I/O client 104(1), the MHPC 232 extracts a power mode vote 434 having a value of one (1), corresponding to the active mode. The power mode vote 434 is stored as the power mode vote 402 in the MHPC request status register 308. The MHPC 232 then applies the voting logic 300 as described above to the MHPC request status register 308 to determine whether a power mode of the flash-memory-based storage device 106 should be changed. In this example, the active power mode is the highest requested power mode, and thus a power mode change command 436 is sent to the flash-memory-based storage device 106 to request a transition to the active power mode. A response message 438 with a "GOOD" status indicating a successful power mode change is received from the flash-memory-based storage device 106, and transmitted to the I/O client 104(1) as a response message 440 indicating a successful power mode change.

Figure 5A:
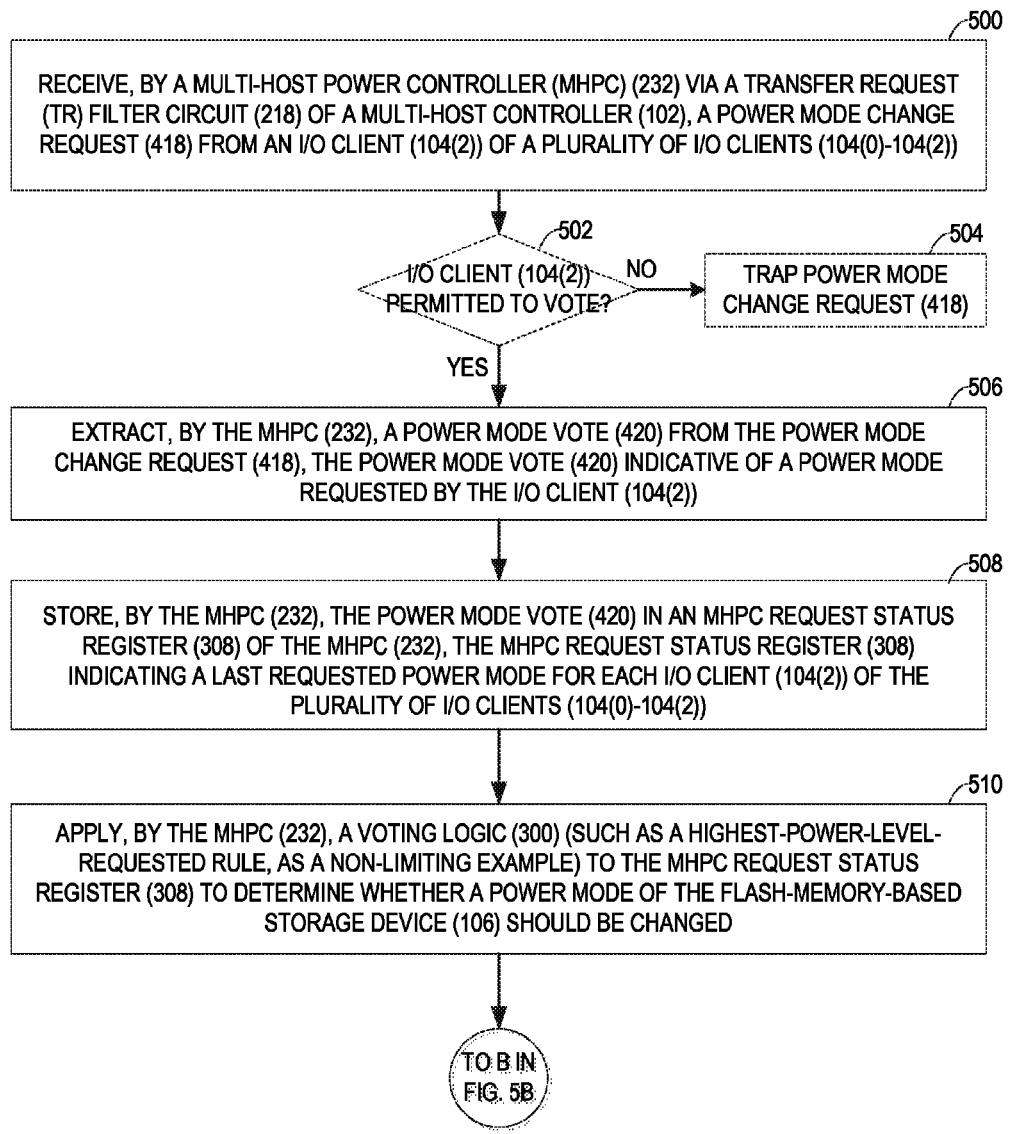
FIGS. 5A and 5B are flowcharts illustrating exemplary operations of the MHPC of FIGS. 2 and 3 for controlling power modes of a flash-memory-based storage device.
Figure 5B:
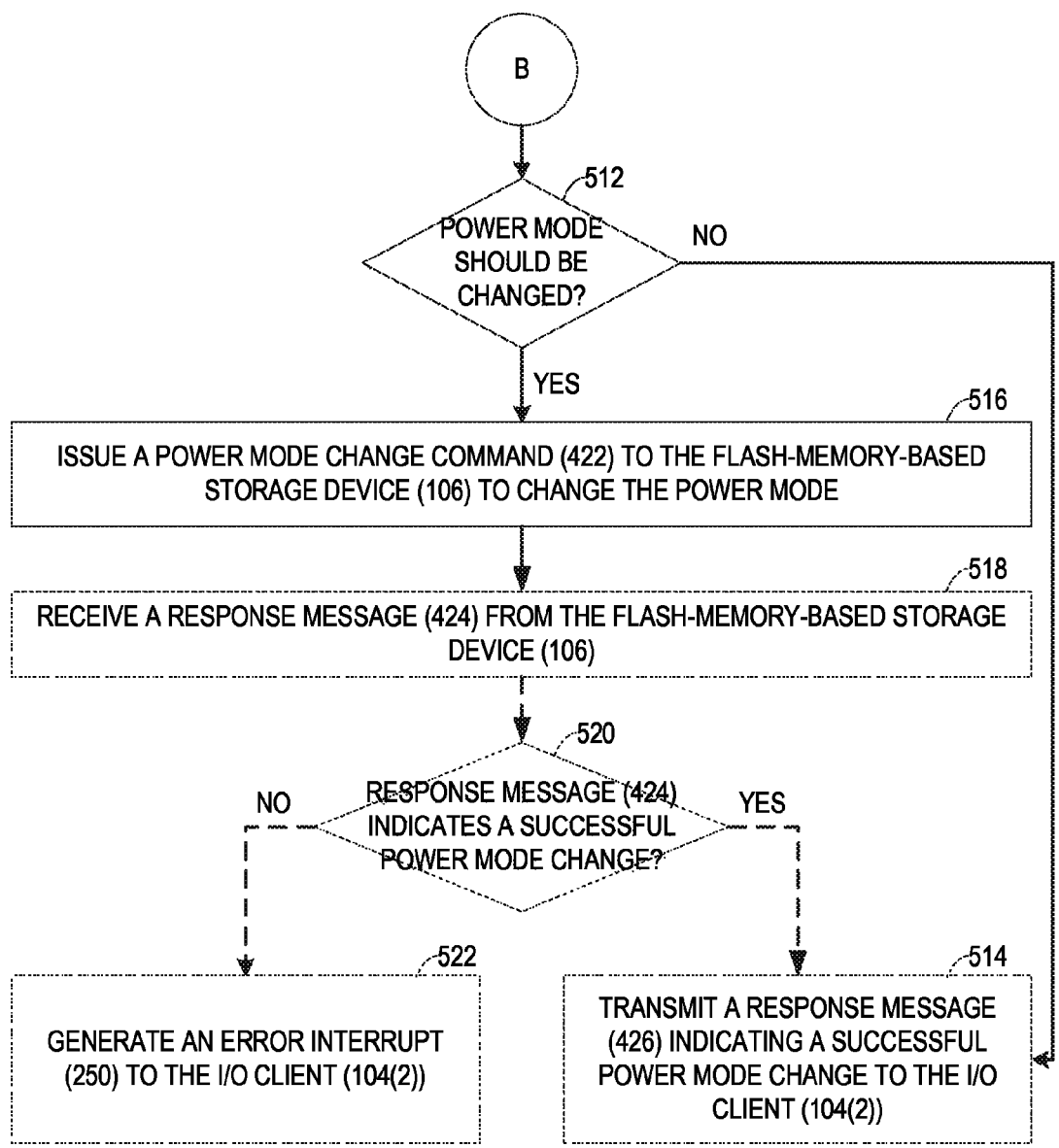

To illustrate exemplary operations of the MHPC 232 of FIGS. 2 and 3 for controlling power modes of the flash-memory-based storage device 106 of FIG. 1, FIGS. 5A and 5B are provided. In describing FIGS. 5A and 5B, elements of FIGS. 1-3 and 4A-4E are referenced for the sake of clarity. In FIG. 5A, operations begin with the MHPC 232 receiving, via the TR filter circuit 218 of the multi-host controller 102, a power mode change request 418 from an I/O client, such as the I/O client 104(2), of a plurality of I/O clients 104(0)-104(2) (block 500). In some aspects, the power mode change request 418 may comprise a SCSI SSU command or an eMMC Sleep (CMD5) command, as non-limiting examples. The MHPC 232 may thus be referred to herein as a "means for receiving a power mode change request."

The MHPC 232 according to some aspects may next determine whether the I/O client 104(2) is permitted to vote, based on the contents of the MHPC control register 304 (block 502). If the MHPC control register 304 indicates that the I/O client 104(2) is not a participating I/O client 104(2), the power mode change request 418 may be trapped and processed accordingly (block 504). However, if the MHPC 232 determines at decision block 502 that the I/O client 104(2) is permitted to vote, the MHPC 232 extracts the power mode vote 420 from the power mode change request 418, the power mode vote 420 indicative of a power mode requested by the I/O client 104(2) (block 506). Accordingly, the MHPC 232 may be referred to herein as a "means for extracting a power mode vote." In some aspects in which the flash-memory-based storage device 106 is a UFS storage device, the power mode vote 420 may represent the contents of a SCSI SSU PC field having a value of one (1) representing an active power mode, a value of two (2) representing a sleep power mode, and a value of three (3) representing a power down power mode. According to some aspects in which the flash-memory-based storage device 106 is an eMMC storage device, the power mode vote 420 may include a one-bit indication of one of SLEEP and ACTIVE power modes. The power mode vote 420 is then stored by the MHPC 232 in an MHPC request status register 308 of the MHPC 232, the MHPC request status register 308 indicating a last requested power mode for each I/O client 104(2) of the plurality of I/O clients 104(0)-104(2) (block 508).

The MHPC 232 then applies the voting logic 300 (such as a highest-power-level-requested rule, as a non-limiting example) to the MHPC request status register 308 to determine whether a power mode of the flash-memory-based storage device 106 should be changed (block 510). In some aspects, the voting logic 300 implements a policy in which the flash-memory-based storage device 106 operates in the lowest power mode permitted by all participating I/O clients 104(0)-104(N), or, alternatively, the highest power mode required by any of the participating I/O clients 104(0)-104(N). In this regard, the MHPC 232 may be referred to herein as a "means for applying a voting logic to the MHPC request status register."

Referring now to FIG. 5B, the MHPC 232 determines, based on applying the voting logic 300, whether the power mode should be changed (block 512). If the MHPC 232 determines at decision block 512 that the current power mode of the flash-memory-based storage device 106 should be maintained, the MHPC 232 transmits a response message 426 to the I/O client 104(2) indicating a successful power mode change, without actually changing the power mode (block 514). However, if it is determined at decision block 512 that the current power mode of the flash-memory-based storage device 106 should be changed, the MHPC 232 issues a power mode change command 422 to the flash-memory-based storage device 106 to change the power mode (block 516). Thus, the MHPC 232 may be referred to herein as a "means for issuing a power mode change command."

In some aspects, the MHPC 232 may then receive a response message 424 from the flash-memory-based storage device 106 (block 518). Accordingly, the MHPC 232 may be referred to herein as a "means for receiving a response message from the flash-memory-based storage device." The response message 424 may be evaluated by the MHPC 232 to determine whether the response message 424 indicates a successful power mode change by the flash-memory-based storage device 106 (block 520). If it is determined at decision block 520 that a successful power mode change is indicated by the response message 424, the MHPC 232 transmits a response message 426 to the I/O client 104(2) indicating a successful power mode change (block 514). In this regard, the MHPC 232 may be referred to herein as a "means for transmitting a response message from the MHPC indicating a successful power mode change to the I/O client." If the power mode change was unsuccessful, the MHPC 232 may generate an error interrupt 250 to the I/O client 104(2). The MHPC 232 thus may be referred to herein as a "means for generating an error interrupt to the I/O client."

The multi-host power controller of a flash-memory-based storage device according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
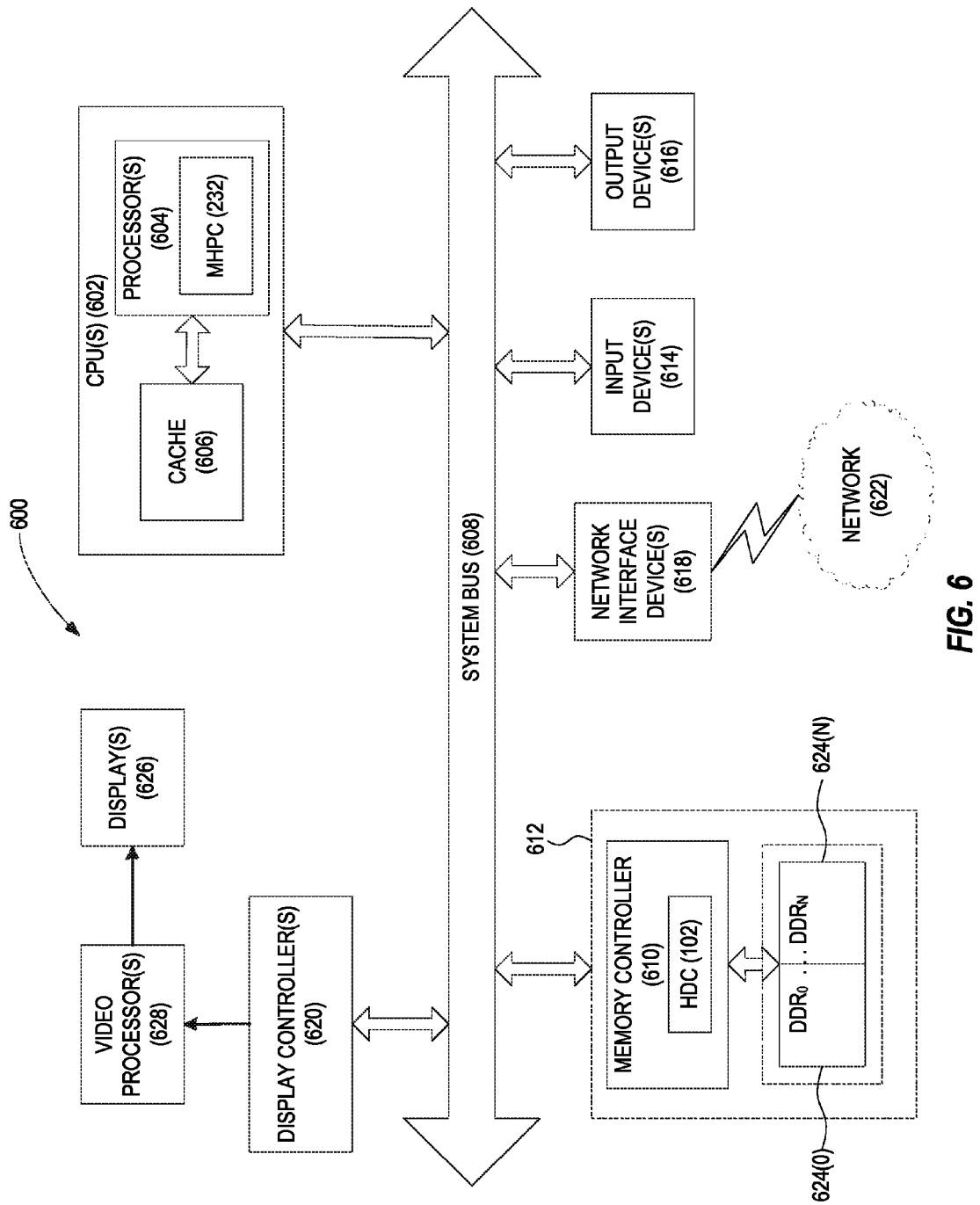
FIG. 6 is a block diagram of an exemplary computing device that may include an SoC that employs the MHPC of FIGS. 2 and 3 within the multi-host controller.

In this regard, FIG. 6 illustrates an example of a processor-based system 600 that can employ the SoC 100 of FIG. 2 with the MHPC 232 illustrated in FIG. 3. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided.

Other devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including but not limited to input keys, switches, voice processors, etc. The output device(s) 616 can include any type of output device, including but not limited to audio, video, other visual indicators, etc. The network interface device(s) 618 can be any devices configured to allow exchange of data to and from a network 622. The network 622 can be any type of network, including but not limited to a wired or wireless network, a private or public network, a local area network (LAN), a wide local area network, wireless local area network, BLUETOOTH (BT), and the Internet. The network interface device(s) 618 can be configured to support any type of communications protocol desired. The memory system 612 can include one or more memory units 624(0)-624(N).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including but not limited to a cathode ray tube (CRT), a liquid crystal display (LCD), a light emitting diode (LED) display, a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multi-host power controller (MHPC) of a multi-host controller, the MHPC communicatively coupled to a plurality of input/output (I/O) clients and to a flash-memory-based storage device configured to provide storage for the plurality of I/O clients;
   the MHPC comprising an MHPC request status register configured to indicate a last requested power mode of the flash-memory-based storage device for each I/O client of the plurality of I/O clients; and
   the MHPC configured to:
      receive, via a transfer request (TR) filter circuit of the multi-host controller, a power mode change request directed to the flash-memory-based storage device from an I/O client of the plurality of I/O clients;
      extract a power mode vote from the power mode change request, the power mode vote indicative of a power mode of the flash-memory-based storage device requested by the I/O client;
      store the power mode vote in the MHPC request status register of the MHPC;
      apply a voting logic to the MHPC request status register to determine whether a power mode of the flash-memory-based storage device should be changed; and
      responsive to determining that the power mode should be changed, issue a power mode change command from the MHPC to the flash-memory-based storage device to change the power mode.

2. The MHPC of claim 1, configured to receive the power mode change request by receiving one of a Small Computer System Interface (SCSI) START STOP UNIT (SSU) command and an Embedded MultiMedia Card (eMMC) Sleep (CMD5) command.

3. The MHPC of claim 1, communicatively coupled to the flash-memory-based storage device according to an eMMC standard, and configured to extract the power mode vote from the power mode change request by extracting a one-bit indication of one of SLEEP and ACTIVE power modes from an eMMC Sleep (CMD5) command.

4. The MHPC of claim 1, communicatively coupled to the flash-memory-based storage device according to a Universal Flash Storage (UFS) standard, and configured to extract the power mode vote from the power mode change request by extracting a value of a Power Condition (PC) field within a SCSI SSU command, the value of the PC field selected from a value of one (1) representing an active power mode, a value of two (2) representing a sleep power mode, and a value of three (3) representing a power down power mode.

5. The MHPC of claim 1, configured to apply the voting logic to the MHPC request status register by applying a highest-power-level-requested rule to the MHPC request status register to determine whether the power mode of the flash-memory-based storage device should be changed.

6. The MHPC of claim 1, further comprising an MHPC control register configured to indicate, for each I/O client of the plurality of I/O clients, whether the I/O client is permitted to vote;
   the MHPC configured to extract the power mode vote for the I/O client responsive to determining, based on the MHPC control register, that the I/O client is permitted to vote.

7. The MHPC of claim 1, further configured to, responsive to determining that the power mode should be changed and issuing the power mode change command to the flash-memory-based storage device to change the power mode:
   receive a response message from the flash-memory-based storage device;
   responsive to determining that the response message indicates a successful power mode change, transmit a response message from the MHPC indicating the successful power mode change to the I/O client; and
   responsive to determining that the response message indicates an unsuccessful power mode change, generate an error interrupt to the I/O client.

8. The MHPC of claim 1, further configured to, responsive to determining that the power mode should not be changed, transmit a response message from the MHPC indicating a successful power mode change to the I/O client.

9. The MHPC of claim 1 integrated into an integrated circuit (IC).

10. The MHPC of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

11. A method for controlling power modes of a flash-memory-based storage device for multiple hosts, comprising:
   receiving, by a multi-host power controller (MHPC) via a transfer request (TR) filter circuit of a multi-host controller, a power mode change request directed to a flash-memory-based storage from an input/output (I/O) client of a plurality of I/O clients;
   extracting, by the MHPC, a power mode vote from the power mode change request, the power mode vote indicative of a power mode of the flash-memory-based storage device requested by the I/O client;
   storing, by the MHPC, the power mode vote in an MHPC request status register of the MHPC, the MHPC request status register indicating a last requested power mode for each I/O client of the plurality of I/O clients;
   applying, by the MHPC, a voting logic to the MHPC request status register to determine whether a power mode of the flash-memory-based storage device should be changed; and responsive to determining that the power mode should be changed, issuing a power mode change command from the MHPC to the flash-memory-based storage device to change the power mode.

12. The method of claim 11, wherein receiving the power mode change request comprises one of a Small Computer System Interface (SCSI) START STOP UNIT (SSU) command and an Embedded MultiMedia Card (eMMC) Sleep (CMD5) command.

13. The method of claim 11, wherein:
the flash-memory-based storage device comprises an Embedded MultiMedia Card (eMMC) device; and
extracting the power mode vote from the power mode change request comprises extracting a one-bit indication of one of SLEEP and ACTIVE power modes from an eMMC Sleep (CMD5) command.

14. The method of claim 11, wherein:
the flash-memory-based storage device comprises a Universal Flash Storage (UFS) device; and
extracting the power mode vote from the power mode change request comprises extracting a value of a Power Condition (PC) field within a SCSI SSU command, the value of the PC field selected from a value of one (1) representing an active power mode, a value of two (2) representing a sleep power mode, and a value of three (3) representing a power down power mode.

15. The method of claim 11, wherein applying the voting logic to the MHPC request status register comprises applying a highest-power-level-requested rule to the MHPC request status register to determine whether the power mode of the flash-memory-based storage device should be changed.

16. The method of claim 11, wherein extracting the power mode vote for the I/O client is responsive to determining, based on an MHPC control register, that the I/O client is permitted to vote.

17. The method of claim 11, further comprising, responsive to determining that the power mode should be changed and issuing the power mode change command to the flash-memory-based storage device to change the power mode:
receiving a response message from the flash-memory-based storage device;
responsive to determining that the response message indicates a successful power mode change, transmitting a response message from the MHPC indicating the successful power mode change to the I/O client; and
responsive to determining that the response message indicates an unsuccessful power mode change, generating an error interrupt to the I/O client.

18. The method of claim 11, further comprising, responsive to determining that the power mode should not be changed, transmitting a response message from the MHPC indicating the successful power mode change to the I/O client.

19. A multi-host power controller (MHPC) of a multi-host controller, the MHPC comprising:
a means for receiving a power mode change request directed to a flash-memory-based storage device from an input/output (I/O) client of a plurality of I/O clients;
a means for extracting a power mode vote from the power mode change request, the power mode vote indicative of a power mode of the flash-memory-based storage device requested by the I/O client;
a means for storing the power mode vote in an MHPC request status register of the MHPC, the MHPC request status register indicating a last requested power mode for each I/O client of the plurality of I/O clients;
a means for applying a voting logic to the MHPC request status register to determine whether a power mode of a flash-memory-based storage device should be changed; and
a means for issuing a power mode change command from the MHPC to the flash-memory-based storage device to change the power mode, responsive to determining that the power mode should be changed.

20. The MHPC of claim 19, wherein the means for receiving the power mode change request comprises a means for receiving one of a Small Computer System Interface (SCSI) START STOP UNIT (SSU) command and an Embedded MultiMedia Card (eMMC) Sleep (CMD5) command.

21. The MHPC of claim 19, wherein:
the flash-memory-based storage device comprises an Embedded MultiMedia Card (eMMC) device; and
the means for extracting the power mode vote from the power mode change request comprises a means for extracting a one-bit indication of one of SLEEP and ACTIVE power modes from an eMMC Sleep (CMD5) command.

22. The MHPC of claim 19, wherein:
the flash-memory-based storage device comprises a Universal Flash Storage (UFS) device; and
the means for extracting the power mode vote from the power mode change request comprises a means for extracting a value of a Power Condition (PC) field within a SCSI SSU command, the value of the PC field selected from a value of one (1) representing an active power mode, a value of two (2) representing a sleep power mode, and a value of three (3) representing a power down power mode.

23. The MHPC of claim 19, wherein the means for applying the voting logic to the MHPC request status register comprises a means for applying a highest-power-level-requested rule to the MHPC request status register to determine whether the power mode of the flash-memory-based storage device should be changed.

24. The MHPC of claim 19, wherein the means for extracting the power mode vote for the I/O client comprises a means for determining, based on an MHPC control register, that the I/O client is permitted to vote.

25. The MHPC of claim 19, further comprising:
a means for receiving a response message from the flash-memory-based storage device responsive to determining that the power mode should be changed and issuing the power mode change command to the flash-memory-based storage device to change the power mode;
a means for transmitting a response message from the MHPC indicating a successful power mode change to the I/O client responsive to determining that the response message indicates the successful power mode change; and
a means for generating an error interrupt to the I/O client responsive to determining that the response message indicates an unsuccessful power mode change.

26. The MHPC of claim 19, further comprising a means for transmitting a response message from the MHPC indicating a successful power mode change to the I/O client responsive to determining that the power mode should not be changed.

27. A multi-host power controller (MHPC) of a multi-host controller, the MHPC communicatively coupled to a plurality of input/output (I/O) clients and to a flash-memory-based storage device configured to provide storage for the plurality of I/O clients;

the MHPC comprising an MHPC request status register configured to indicate a last requested power mode of the flash-memory-based storage device as a stored power mode vote for each I/O client of the plurality of I/O clients; and the MHPC configured to:

receive, via a transfer request (TR) filter circuit of the multi-host controller, a power mode change request directed to the flash-memory-based storage device from an I/O client of the plurality of I/O clients;

extract a power mode vote from the power mode change request, the power mode vote indicative of a power mode of the flash-memory-based storage device requested by the I/O client;

store the power mode vote in the MHPC request status register of the MHPC;

apply a voting logic to the stored power mode vote in the MHPC request status register to determine whether a power mode of the flash-memory-based storage device should be changed; and responsive to determining that the power mode should be changed, issue a power mode change command from the MHPC to the flash-memory-based storage device to change the power mode.

\* \* \* \* \*